United States Patent
Furuyama et al.

(10) Patent No.: US 8,715,382 B2
(45) Date of Patent: May 6, 2014

(54) VENTILATION MEMBER

(71) Applicant: Nitto Denko Corporation, Ibaraki (JP)

(72) Inventors: Satoru Furuyama, Osaka (JP); Toshiki Yanagi, Osaka (JP)

(73) Assignee: Nitto Denko Corporation, Osaka (JP)

( * ) Notice: Subject to any disclaimer, the term of this patent is extended or adjusted under 35 U.S.C. 154(b) by 0 days.

(21) Appl. No.: 13/755,791

(22) Filed: Jan. 31, 2013

(65) Prior Publication Data

US 2013/0139484 A1    Jun. 6, 2013

Related U.S. Application Data

(63) Continuation of application No. 11/990,726, filed as application No. PCT/JP2006/316473 on Aug. 23, 2006, now Pat. No. 8,414,672.

(30) Foreign Application Priority Data

Aug. 24, 2005  (JP) ................... 2005-243271
Jun. 15, 2006  (JP) ................... 2006-166686

(51) Int. Cl.
    *B01D 46/00* (2006.01)
(52) U.S. Cl.
    USPC ............... 55/385.4; 55/503; 55/504; 55/505; 96/4
(58) Field of Classification Search
    USPC ............. 55/307, 385.2, 385.4, 490, 492, 495, 55/496, 497, 498, 502, 505; 454/184, 454/270–274; 277/928; 220/202–203.02, 220/371–373; 215/261; 96/4
    See application file for complete search history.

(56) References Cited

U.S. PATENT DOCUMENTS

| | | | |
|---|---|---|---|
| 4,256,474 A | 3/1981 | Berger et al. |
| 4,401,093 A | 8/1983 | Gates et al. |
| 4,673,423 A | 6/1987 | Yumlu |
| 4,957,518 A | 9/1990 | Brassell |

(Continued)

FOREIGN PATENT DOCUMENTS

| | | |
|---|---|---|
| EP | 0 377 067 | 7/1990 |
| EP | 1 202 616 | 5/2002 |

(Continued)

*Primary Examiner* — Duane Smith
*Assistant Examiner* — Thomas McKenzie
(74) *Attorney, Agent, or Firm* — Hamre, Schumann, Mueller & Larson, P.C.

(57) ABSTRACT

A ventilation member (100) of the invention includes a tubular part (11), a gas permeable filter (19), and a cover part (31). In an attached state where the tubular part (11) is fit into the cover part (31), gaps functioning as gas passages ($AR_2$ and $AR_3$) are formed between a bottom portion (35) of the cover part (31) and the gas permeable filter (19) and between a side wall portion (39) of the cover part (31) and a body portion (17) of the tubular part (11). The opening area ($S2$) of a filter-end opening (15) with respect to an in-plane direction (WL) perpendicular to the thickness direction of the gas permeable filter (19) is larger than the opening area ($S1$) of a connection-end opening (13) with respect to the in-plane direction (WL).

6 Claims, 21 Drawing Sheets

(56) References Cited

U.S. PATENT DOCUMENTS

| | | |
|---|---|---|
| 5,348,570 A | 9/1994 | Ruppert et al. |
| 5,509,949 A | 4/1996 | Gluys et al. |
| 5,891,223 A | 4/1999 | Shaw |
| 5,914,415 A | 6/1999 | Tago |
| 6,015,444 A | 1/2000 | Craft et al. |
| 6,364,924 B1 * | 4/2002 | Mashiko et al. ............. 55/385.4 |
| 6,447,565 B1 | 9/2002 | Raszkowski et al. |
| 6,521,024 B1 | 2/2003 | Akahori et al. |
| 6,524,361 B1 | 2/2003 | Thornton et al. |
| 8,016,904 B2 | 9/2011 | Gwin et al. |

FOREIGN PATENT DOCUMENTS

| | | |
|---|---|---|
| EP | 1 363 484 | 11/2003 |
| JP | 41-024461 | 12/1966 |
| JP | 55-038030 | 3/1980 |
| JP | 60-009522 | 1/1985 |
| JP | 62-163671 | 10/1987 |
| JP | 3-104571 | 10/1991 |
| JP | 10-085536 | 4/1998 |
| JP | 2001-143524 | 5/2001 |

* cited by examiner

VENTILATION MEMBER

TECHNICAL FIELD

The present invention relates to a ventilation member that makes use of a gas permeable filter having gas permeability and waterproofness.

BACKGROUND ART

As described, for example, in JP10-085536A and JP2001-143524A, ventilation members used for automobile components (lamps, motors, sensors, switches, ECUs, and so forth) make use of a gas permeable filter (gas permeable membrane) having gas permeability, dustproofness, and waterproofness. Adaptation of such ventilation members to electrical devices, such as mobile communication devices, cameras, electric shavers, and electric toothbrushes, now is being discussed.

The ventilation members as described above play a role of eliminating a pressure difference between the interior and the exterior of the device, propagating sounds, or discharging a gas generated inside the device while preventing the entry of dust or water into the interior of the device. For instance, fogging possibly occurs on a headlight of an automobile with a change in temperature, and ventilation members are adopted with the aim of preventing or eliminating the occurrence of such fogging.

Incidentally, if we assume that the dustproof and waterproof capabilities are the same, then ventilation members are more efficient if they require a shorter time to eliminate a pressure difference between the interior and the exterior of the device or a shorter time to discharge a gas generated inside the device. These times can be shortened by increasing a gas permeation quantity per unit time of the ventilation members.

Increasing a gas permeation quantity of the ventilation members, however, is not readily achieved. The bottleneck in a gas permeation quantity is a gas permeable filter that has large gas permeation resistance, but the gas permeable filter has been improved to the point that further improvement is difficult.

As the ventilation members per se increase in size, the gas permeation quantity naturally increases in proportion. Size changing of the ventilation members, however, is not readily adopted, because it involves a design change at the other end (at the device end).

Further, in recent years, there has been a need for ventilation members that excel more in durability against foreign matter, such as water droplets and dust. For example, as ventilation members to be used for lamps or the housings of ECUs in an automobile, there is a need for ventilation members not only capable of withstanding car washing, in particular, high-pressure car washing, but also capable of completely preventing the entry of water into the interior of the housings.

DISCLOSURE OF THE INVENTION

In view of the foregoing, the invention has an object to provide a ventilation member that has a larger gas permeation quantity per unit time.

The invention has another object to provide a ventilation member that excels more in durability against foreign matter, such as water droplets and dust.

More specifically, an aspect of the invention provides a ventilation member that includes a tubular part, in an interior of which a gas passage for an object that needs ventilation is formed, a gas permeable filter disposed at one of openings of the tubular part, and a cover part, inside of which the tubular part is fit. The tubular part includes a connection-end opening, which is an opening on a side on which the object is to be connected, a filter-end opening, which is an opening closed by the gas permeable filter, and a body portion positioned between the connection-end opening and the filter-end opening. The cover part includes a bottom portion that faces the gas permeable filter in an attached state where the tubular part is fit inside from a side of the gas permeable filter and a side wall portion that extends from the bottom portion so as to surround the filter-end opening and the body portion from outside. Gaps functioning as gas passages that communicate with an exterior are formed in the attached state between the bottom portion of the cover part and the gas permeable filter and between the side wall portion of the cover part and the body portion of the tubular part. An opening area of the filter-end opening with respect to an in-plane direction perpendicular to a thickness direction of the gas permeable filter is larger than an opening area of the connection-end opening with respect to the in-plane direction.

As has been described, almost all the objects (for example, headlights and ECUs in an automobile) to which is applied the ventilation member of the invention do not allow for a design change only for the ventilation member. It is therefore normal that a change in dimension and so forth is not allowed at the connection-end opening of the ventilation member. The ventilation member, however, allows for improvement on the side on which the gas permeable filter is attached. In other words, the ventilation member of the invention is configured in such a manner that, of the openings of the tubular part at the both ends, the opening area of the filter-end opening, which is the opening on the side on which the gas permeable filter is attached, is intentionally enlarged. When configured in this manner, it is possible to enlarge the area of the gas permeable filter that contributes to ventilation without the need to change the dimension of the connection-end opening. When the area of the gas permeable filter is enlarged, a gas permeation quantity per unit time can be increased in proportion to the enlarged quantity.

In the ventilation member of the invention, it is possible to make an inner wall of the body portion of the tubular part to have a stepped shape or a tapered shape, so that a difference of opening areas is provided between the connection-end opening and the filter-end opening according to the stepped shape or the tapered shape. When configured in this manner, it is possible to adopt a gas permeable filter having a large area without the need to increase the dimension of the cover part.

The cover part may include plural spacers that support the tubular part along the filter-end opening in the attached state where the tubular part is fit inside the cover part. The plural spacers prevent the bottom portion of the cover part from contacting closely with the gas permeable filter entirely, so that one of the gaps formed between the bottom portion of the cover part and the gas permeable filter is secured. When configured in this manner, not only is it possible to protect the gas permeable filter from dust, water droplets, and a physical shock in a reliable manner with the cover part, but it is also possible to form a gap that servers as a gas passage between the cover part and the gas permeable filter. In addition, by providing the spacers that support the tubular part in a distributed manner, it is possible to utilize spaces between the respective spacers that are adjacent to each other as gas passages.

In a more preferable configuration, the body portion of the tubular part may include an inner body portion and an outer body portion that surrounds the inner body portion. Herein, assuming that the thickness direction of the gas permeable filter is an axis line direction, a side in the axis line direction on which the filter-end opening is located is a front side, and a side on which the connection-end opening is located is a rear side, then by configuring in such a manner that a front end portion of the inner body portion is retracted to a position in the rear of a front end portion of the outer body portion, it is possible to form the front end portion of the outer body portion as a thin filter-end opening to which the gas permeable filter is attached. Further, coupling portions formed integrally with the inner body portion and the outer body portion may be provided between these portions at plural points in a circumferential direction. Accordingly, gaps that open frontward in the axis line direction and communicate with the space inside the tube of the tubular part are defined between the respective coupling portions that are adjacent to each other. When configured in this manner, it is possible to form gaps between the inner body portion and the outer body portion while producing a change in opening area. Because this configuration in turn can shorten the molding time of the tubular part (to be more concrete, the cooling time), the cost saving derived from the enhanced productivity can be expected.

It is also possible to have a structure in which the inner body portion and the outer body portion are connected to each other directly along an entire circumference on the rear side in the axis line direction. When configured in this manner, it is possible to make the connection-end opening sufficiently thick, and the ventilation member can be attached to the device that needs ventilation in a reliable manner.

At least one of the cover part and the tubular part may include fixing pieces positioned at plural points in a circumferential direction between the tubular part and the side wall portion of the cover part in the attached state. Also, gaps functioning as gas passages that communicate with the exterior can be formed between the respective fixing pieces that are adjacent to each other, and relative positions of the cover part and the tubular part can be determined through elastic deformation of at least one of the tubular part and the fixing pieces. According to the fixing pieces as described above, not only can the cover part and the tubular part be fixed relatively with respect to each other with ease, but also gas passages can be formed naturally between the cover part and the tubular part.

To be more concrete, a material of one of the cover part and the tubular part is elastomer and a material of the other is resin or metal that has no rubber elasticity. More preferably, the tubular part is made of elastomer and the cover part is made of hard resin. Further, fixing pieces, which are in contact with the tubular part in the attached state where the tubular part is fit in the cover part, are disposed at the side wall portion of the cover part at plural points in the circumferential direction. When configured in this manner, the tubular part is placed under an external force from the fixing pieces in the attached state and undergoes elastic deformation. It is therefore possible to fix the tubular part and the cover part to each other by an elastic restoring force of the tubular part.

Another aspect of the invention provides a ventilation member that includes a tubular part, in an interior of which a gas passage for an object that needs ventilation is formed, a gas permeable filter attached to the tubular part, and a cover part that defines a gap between itself and the gas permeable filter in an attached state where the tubular part is fit inside from a side of the gas permeable filter. The gas passage formed in the interior of the tubular part includes a first gas passage that is to communicate directly with an interior space of the object and a second gas passage isolated from the first gas passage. The gas permeable filter is attached to the tubular part so as to close at least an opening on the basis of the first gas passage. A gas thus is allowed to circulate between the first gas passage and the second gas passage via the gap and the gas permeable filter.

BRIEF DESCRIPTION OF THE DRAWINGS

FIG. 2 is attached to the housing of a device that needs ventilation.

BEST MODE FOR CARRYING OUT THE INVENTION

First Embodiment

Figure 1:
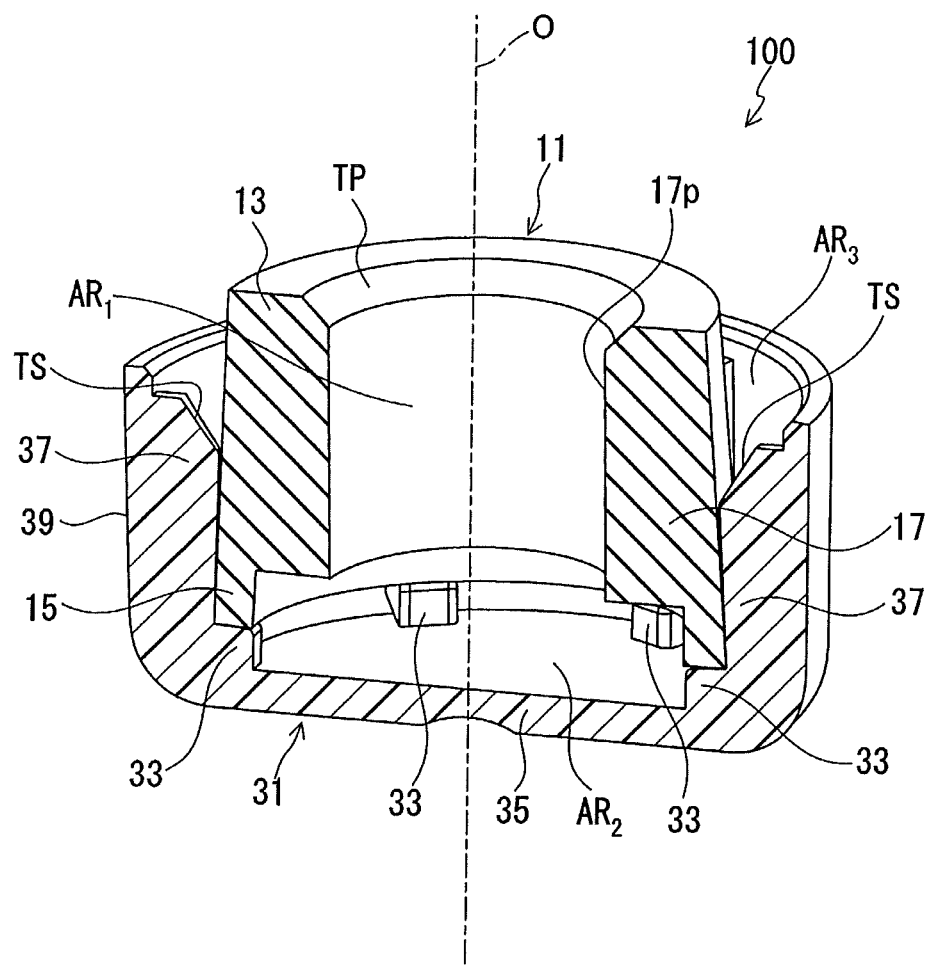
FIG. 1 is a sectional perspective view of a ventilation member of the invention.
Figure 2:
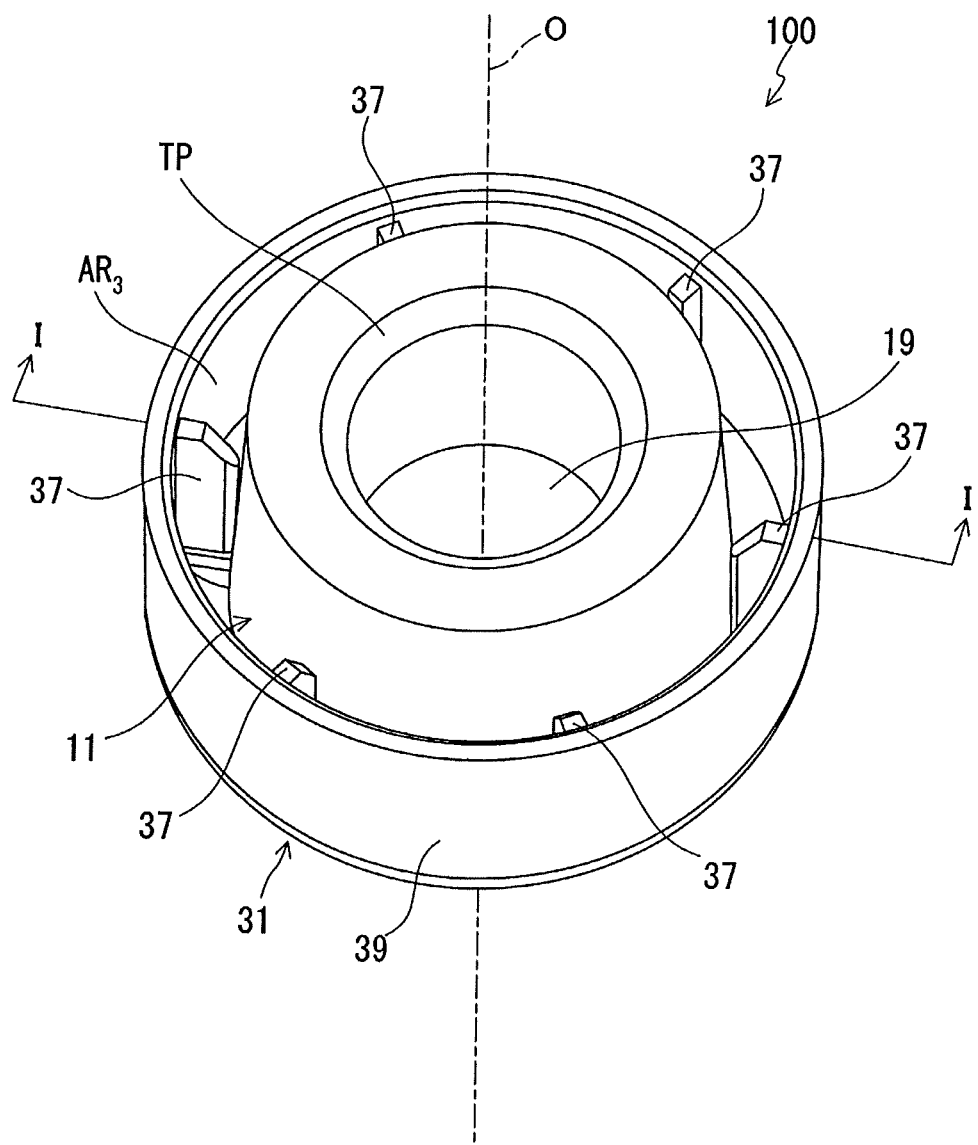
FIG. 2 is a perspective view of the ventilation member of FIG. 1.
Figure 3:
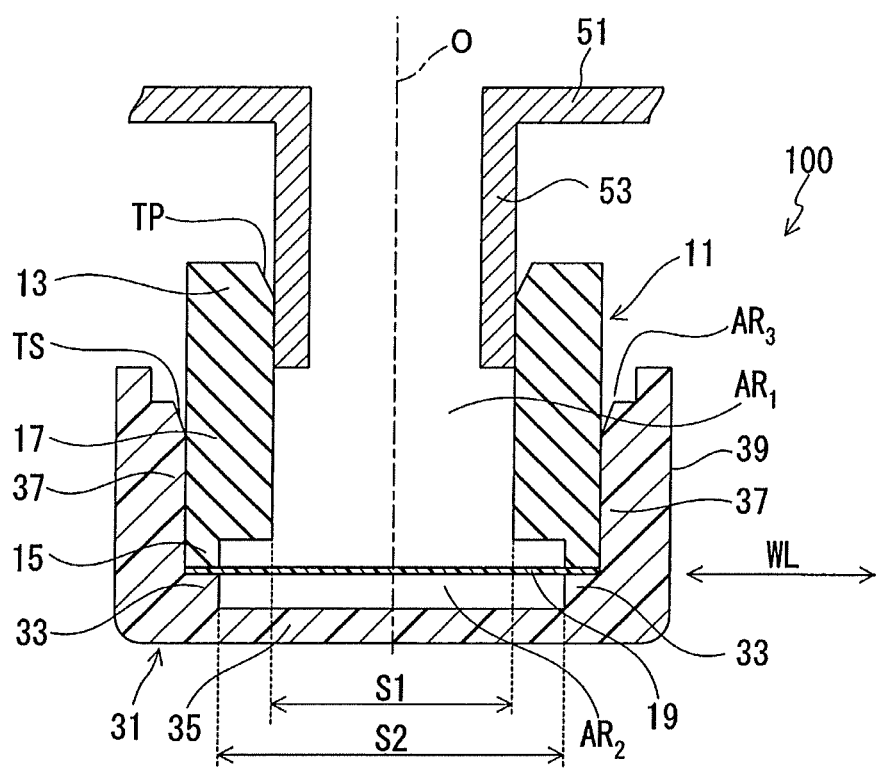
FIG. 3 is a cross section showing a state where the ventilation member of FIG. 1

FIG. 1 is a sectional perspective view of a ventilation member of the invention. FIG. 2 is a perspective view of the ventilation member of FIG. 1. FIG. 3 is a cross section showing a state where the ventilation member of FIG. 1 and FIG. 2 is attached to the housing of a device that needs ventilation. As is shown in FIG. 3, by attaching a ventilation member 100 to a nozzle-like filter-attached portion 53 provided to a housing 51 of the device, it is possible to ventilate the interior of the housing 51 while preventing the entry of foreign matter, such as water droplets. In addition, it is possible to maintain the internal pressure of the housing 51 equal to the external pressure.

As shown in FIG. 1, FIG. 2, and FIG. 3, the ventilation member 100 includes a tubular part 11, a gas permeable filter 19, and a cover part 31. The gas permeable filter 19, however, is omitted in FIG. 1. The tubular part 11 is of an almost circular cylindrical shape and forms a gas passage $AR_1$ that directly communicates with the housing 51 of the device by making use of a space inside the tube. The gas permeable filter 19 is attached to an opening 15, which is one of the openings of the tubular part 11. The cover part 31 is a part into which the tubular part 11 attached with the gas permeable filter 19 is fit from the side of the gas permeable filter 19. As shown in FIG. 1 and FIG. 3, of the openings of the tubular part 11 at the both ends, the opening area S2 of the filter-end opening 15, which is an opening closed by the gas permeable filter 19, is larger than the opening area S1 of the connection-end opening 13, which is an opening to which the filter-attached portion 53 of the housing 51 is to be connected. When configured in this manner, a gas permeation quantity per unit time can be increased by enlarging the effective area of the gas permeable filter 19 to the extent possible.

The term, "the effective area of the gas permeable filter", referred to herein means the area of a portion of the gas permeable filter 19 that actually contributes to ventilation between the interior and the exterior of the tubular part 11. In addition, assuming that an in-plane direction WL is a direction perpendicular to the thickness direction of the gas permeable filter 19, then the opening area of the tubular part 11 is expressed as the opening area with respect to the in-plane direction WL. As can be understood from FIG. 1 and the other related drawings, the thickness direction of the gas permeable filter 19 coincides with a direction parallel to the center axis line O of the tubular part 11. The direction parallel to the center axis line O also is referred to as the axis line direction. In addition, the side on which the filter-end opening 15 is located with respect to the direction parallel to the center axis line O (the lower side in FIG. 3) is referred to as the front side and the side on which the connection-end opening 13 (the upper side in FIG. 3) is located is referred to as the rear side.

Hereinafter, reference will be made to the structure of the ventilation member 100 in a state where respective parts are assembled with each other by describing these parts individually in detail.

As shown in FIG. 1 and FIG. 3, the tubular part 11 is formed of the connection-end opening 13, which is an opening to which the device that needs ventilation is to be connected, the filter-end opening 15, which is an opening to which the gas permeable filter 19 is attached, and a body portion 17 that connects the connection-end opening 13 and the filter-end opening 15. The interior of the body portion 17 defines a through-hole that penetrates through from the connection-end opening 13 to the filter-end opening 15, and this through-hole forms the gas passage $AR_1$. A taper TP is provided to the inner peripheral portion of the connection-end opening 13 for the nozzle-like filter-attached portion 53 to be inserted with ease. An opening diameter about the center axis line O of the filter-end opening 15 is larger than that of the connection-end opening 13 and a thickness in the radius direction thereof is smaller than that of the connection-end opening portion 13.

The term, "the opening diameter of the connection-end opening 13", referred to herein means the opening diameter of the inner peripheral edge of the taper TP, that is, at the position at which the contact between the filter-attached portion 53 and the tubular part 11 begins. This is because the taper TP is provided by taking into account the ease of attachment for the nozzle-like filter-attached portion 53, and the opening diameter of the connection-end opening 13 should be considered as the position at which a contribution is actually made to the connection to the filter-attached portion 53.

Figure 5:
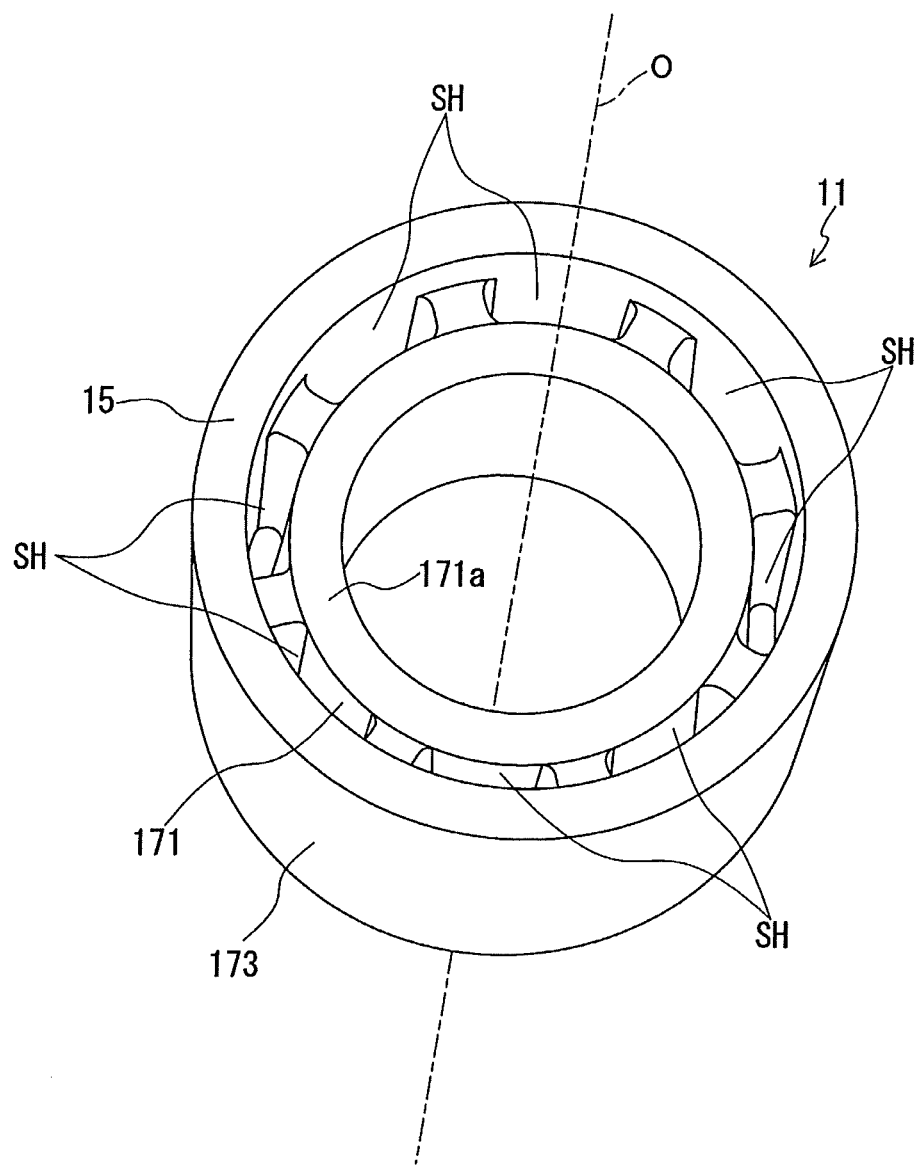
FIG. 5 is a perspective view of the tubular part when viewed from a filter end opening.
Figure 6:
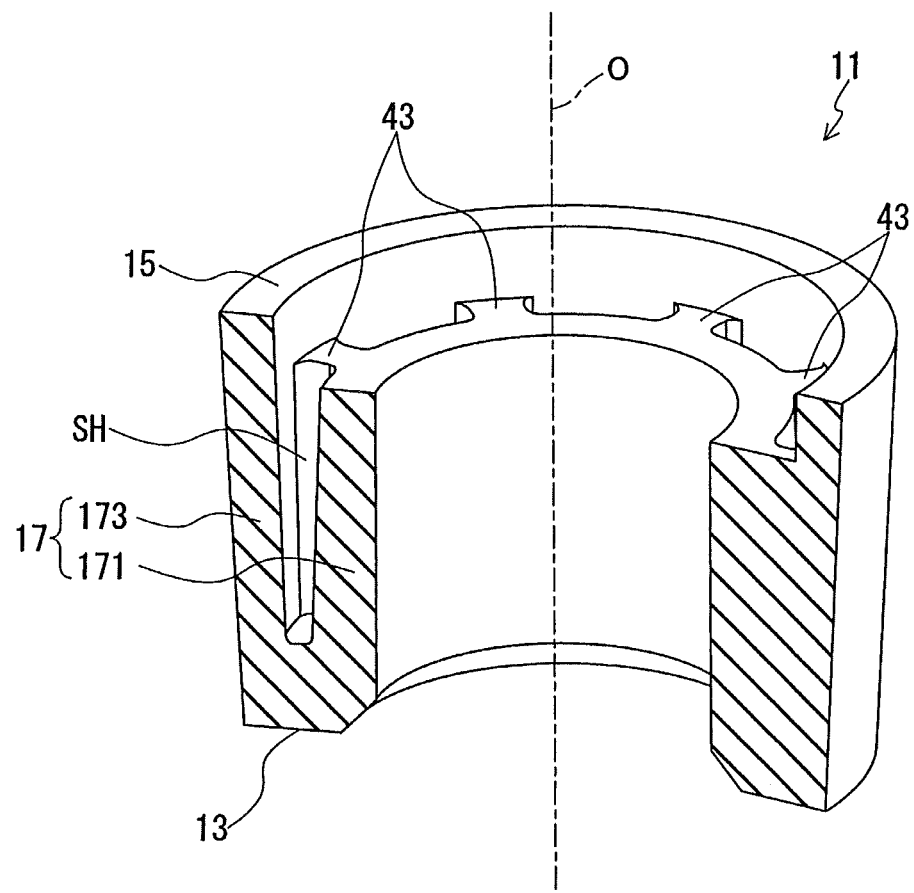
FIG. 6 is a sectional perspective view of the tubular part when viewed in a cross section cut at a plane different from the plane of the cross section of FIG. 1.

As shown in FIG. 5 and FIG. 6, the body portion 17 of the tubular part 11 is formed of an inner body portion 171 and an outer body portion 173 that surrounds the inner body portion 171. The inner body portion 171 and the outer body portion 173 are disposed concentrically about the center axis line O used in common. It should be noted, however, that the outer body portion 173 is of a shape that slightly extends frontward more than the inner body portion 171. In short, the front end portion of the outer body portion 173 forms the filter-end opening 15. By satisfying the positional relationship as above, the inner wall of the body portion 17 of the tubular part 11 consequently has a stepped shape. The body portion 17 having the stepped shape produces a step-wise change in opening area in the in-plane direction WL at a specific position with respect to the direction parallel to the center axis line O. To be more specific, it is possible to produce a difference of opening areas, $\Delta S(=S2-S1)$, between the connection-end opening 13 and the filter-end opening 15 according to the stepped shape of the body portion 17.

In addition, the tubular part 11 includes plural coupling portions 43 that couple the inner body portion 171 and the outer body portion 173. The coupling portions 43 are parts that are positioned between the inner body portion 171 and the outer body portion 173 and formed integrally with these portions. In this embodiment, the coupling portions 43 are provided at plural points in the circumferential direction at equiangular intervals. Accordingly, gaps SH are formed between the respective coupling portions 43 and the adjacent coupling portions 43. Each gap SH opens frontward and communicates with the gas passage $AR_1$ in the interior of the tubular part 11. Meanwhile, the inner body portion 171 and the outer body portion 173 are connected to each other entirely in the circumferential direction on the rear side. The opening diameter of the connection-end opening 13 corresponds to the minor diameter of the inner body portion 171.

The tubular part 11 as described above can be manufactured by molding resin using a known injection molding process. As shown in FIG. 5 and FIG. 6, by providing the gaps SH between the inner body portion 171 and the outer body portion 173, it is possible to shorten the cooling time markedly during the injection molding. According to the knowledge of the inventors, there is a two-fold difference in cooling time between a case where no gaps SH are provided and this embodiment. In short, when configured as in this embodiment, it is expected to achieve the cost saving effect derived from the enhanced productivity.

In this embodiment, thermoplastic elastomer is adopted as a material of the tubular part 11. Examples of the thermoplastic elastomer that can be used as the material of the tubular part 11 include but not limited to thermoplastic elastomers based on polystyrene, polyolefin, polyvinyl chloride, polyester, polyurethane, polyamide, and fluoropolymer. All of these thermoplastic elastomers are suitable owing to their excellent heat resistance, weathering resistance, and chemical resistance.

It is preferable for the thermoplastic elastomer forming the tubular part 11 to have a compression set of 70% or below (preferably, 50% or below) when allowed to stand under the condition of 70° C. for 22 hours (according to JIS K6301) and a hardness of 100 or below (preferably, 80 or below) when measured by an A-type spring hardness tester. When the compression set is too high, oscillations or a temperature change readily gives rise to a clearance between the filter-attached portion 53 of the device (see FIG. 3) and the tubular part 11. Also, when the hardness is too high, it becomes difficult to attach the tubular part 11 to the filter-attached portion 53. Further, in this embodiment, the thickness of the connection-end opening 13 is adjusted to be equal to or larger than a sum of the thickness of the inner body portion 171 and the thickness of the outer body portion 173. Accordingly, when the nozzle-like filter-attached portion 53 is inserted as is shown in FIG. 3, a sufficient contracting force acts on the filter-attached portion 53. This prevents the ventilation member 100 from easily falling off from the filter-attached portion 53.

The gas permeable filter 19 fixed to the filter-end opening 15 of the tubular part 11 can be made of a material having dustproofness, waterproofness, and gas permeability. In order to merely prevent the entry of water droplets, those made of fiber materials, for example, a fabric, a nonwoven fabric, a net, and a powder sintered porous body or a foam having a pore diameter of 10 μm or greater, can be used as the gas permeable filter 19. More than one of these materials may be used in combination or in the form of multiple layers. In a case where the surface is hydrophilic, the surface may be coated with a water-repellent and oil-repellent agent, such as an agent based on fluorine or silicon.

In a case where high waterproofness is required, it is possible to use a resin porous membrane that can be manufactured by a known drawing method or extracting method. The pore diameter of such a porous membrane can be 10 μm or smaller. The water-repellent and oil-repellent agent described above may be coated thereon when the necessity arises. From the viewpoint that satisfactory waterproofness is expected, the average pore diameter of the porous membrane is preferably in a range of 0.01 μm to 10 μm both inclusive. In this embodiment, a porous membrane made of polytetrafluoroethylene is used as the gas permeable filter 19. In addition, in this embodiment, the gas permeable filter 19 is thermally welded to the filter-end opening 15 of the tubular part 11. However, the former may be fixed to the latter by other means, for example, with the use of an adhesive agent. Further, the gas permeable filter 19 simply may be attached to the cover part 31 without being fixed to the tubular part 11.

Figure 7:
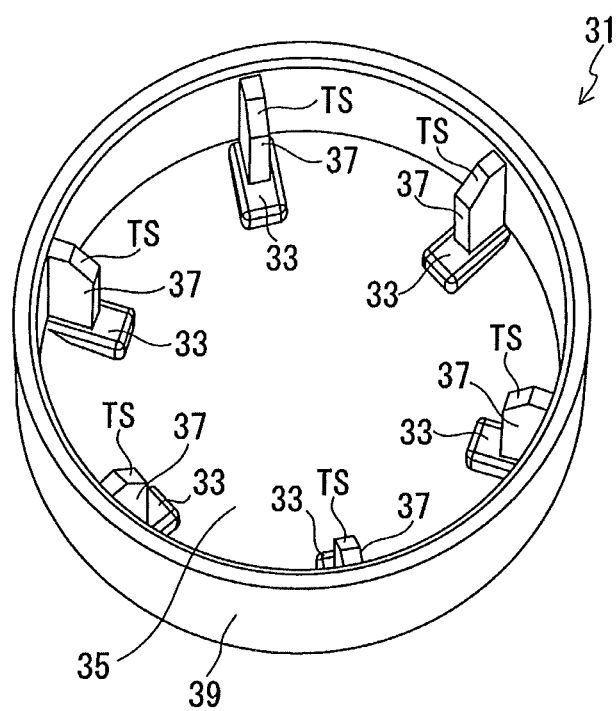
FIG. 7 is a perspective view of a cover part when viewed from a side from which the tubular part is fit therein.
Figure 8:
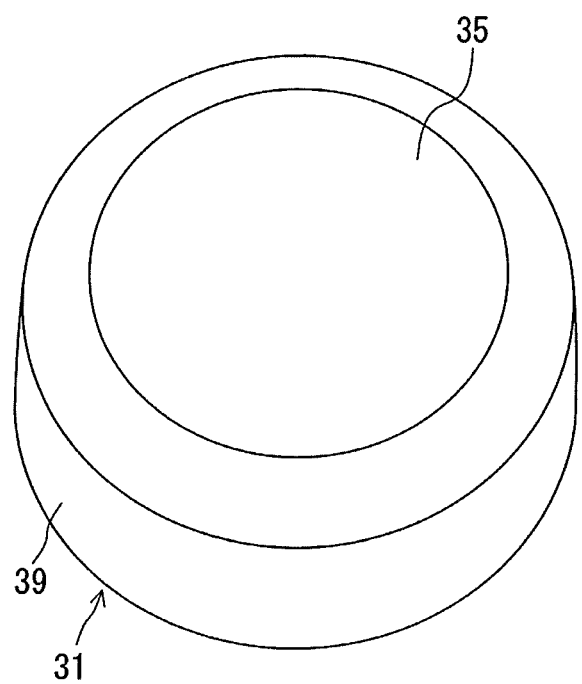
FIG. 8 is a perspective view of the cover part when viewed from the side opposite to the side of FIG. 7.

FIG. 7 is a perspective view of the cover part when viewed from the side from which the tubular part is fit therein. FIG. 8 is a perspective view of the cover part when viewed from the side opposite to the side of FIG. 7. As shown in FIG. 7 and FIG. 8, the cover part 31 is formed of an almost circular bottom portion 35 and a tubular side wall portion 39, and as a whole, it is shaped like a cap suitable to prevent water droplets or the like from directly adhering to the gas permeable filter 19. Protruding spacers 33 are disposed on the bottom portion 35 of the cover part 31 on the side facing the gas permeable filter 19. The spacers 33 are disposed at plural points (three or more points) in the circumferential direction of the circular bottom portion 35 at regular angular intervals. As shown in FIG. 1 and FIG. 3, in an attached state where the tubular part 11 is fit in the cover part 31, the spacers 33 support the tubular part 11 along the filter-end opening 15 and thereby prevent the gas permeable filter 19 from contacting closely with the bottom portion 35 of the cover part 31. A clearance functioning as a gas passage $AR_2$ thus is defined.

Plural (three or more) fixing pieces 37 for fixing the tubular part 11 are provided to the side wall portion 39 of the cover part 31 at the positions corresponding to the spacers 33 on the bottom portion 35. The fixing pieces 37 extend linearly rearward along the inner peripheral surface of the side wall portion 39, that is, in the direction toward which the cover part 31 is open. A taper TS is provided to each fixing piece 37 for the tubular part 11 to slide into the cover part 31 with ease. Because the inner edge of the fixing piece 37 is present on the outer side in the radius direction relative to the inner edge of the corresponding spacer 33, when the tubular part 11 is pushed into the cover part 31, the tubular part 11 is allowed to move forward until it comes into contact with the spacers 33. As is shown in FIG. 3, in the attached state where the tubular part 11 is fit in the cover part 31, the side wall portion 39 of the cover part 31 surrounds the tubular part 11 in the circumferential direction. In the direction parallel to the center axis line O, the fixing pieces 37 of the cover part 31 fasten the tubular part 11 over a broad range across the filter-end opening 15 and the body portion 17. Because both the inner body portion 171 and the outer body portion 173 contribute to the exertion of a contraction force induced by elastic deformation of the tubular part 11, the cover part 31 and the tubular part 11 are assembled firmly with each other.

As with the tubular part 11, the cover part 31 as described above can be manufactured by molding resin using a known injection molding process. A material of the cover part 31 can be hard thermoplastic resin having no rubber elasticity, examples of which include but not limited to polypropylene, polyethylene, polyethyleneterephthalate, and ABS. By forming the tubular part 11 from elastomer and the cover part 31 from hard thermoplastic resin, the tubular part 11 is allowed to undergo elastic deformation so that it is firmly fixed to the inside of the cover part 31. In addition, in this embodiment, fixing pieces are not provided to the tubular part 11 that undergoes elastic deformation, and instead, the fixing pieces 37 are provided to the cover part 31. In the attached state where the tubular part 11 is fit in the cover part 31, the hard fixing pieces 37 exert a strong force in the direction of the center axis line O on the tubular part 11. Accordingly, a strong force is required to pull out the tubular part 11 from the cover part 31. This eliminates not only the need for other fixing means, such as screw clamps, but also the need for stoppers for preventing a fall-off. In addition, in order to secure the largest possible opening area of the filter-end opening 15 as in the tubular part 11 adopted in the ventilation member 100 of the invention, the filter-end opening 15 tends to be thinner. When the thickness of the filter-end opening 15 becomes insufficient, an elastic restoring force needed to fix the tubular part 11 to the cover part 31 is thought to become weaker. However, such a problem hardly occurs according to the fixing pieces 37 of this embodiment. Further, as is shown in FIG. 3, when the nozzle-like filter-attached portion 53 is inserted into the tubular part 11, a force is applied to the tubular part 11 from the inside, too. Accordingly, an inconvenience, such as falling-off of the cover part 31 alone, is extremely unlikely to occur.

It goes without saying that the cover part 31 can be made of elastomer and the tubular part 11 can be made of hard resin. Also, the fixing pieces may be provided to the tubular part 11. However, the nozzle-like filter-attached portion 53 provided, as is shown in FIG. 3, to the housing 51 that needs ventilation is made of hard resin or metal. Hence, by forming the tubular part 11 from elastomer, it is possible to provide the ventilation member 100 that can be attached readily to the filter-attached portion 53.

An action of the ventilation member 100 when the ventilation member 100 is attached to the filter-attached portion 53 of the housing 51 of the device now will be described. Assume that the internal pressure of the housing 51 is higher than the external pressure. Then, a gas (air) within the housing 51 enters into the gas passage $AR_1$ of the tubular part 11 through the connection-end opening 13. The gas also spreads in a clearance between the front end face 171a of the inner body portion 171 and the gas permeable filter 19. The gas having passed through (permeated through) the gas permeable filter 19 then reaches the gas passage $AR_2$ defined between the gas permeable filter 19 and the bottom portion 35 of the cover part 31. The gas having reached the gas passage $AR_2$ diffuses to the outside of the ventilation member 100 by way of the gas passages $AR_3$ defined between the respective fixing pieces 37 and the adjacent fixing pieces 37.

Figure 4:
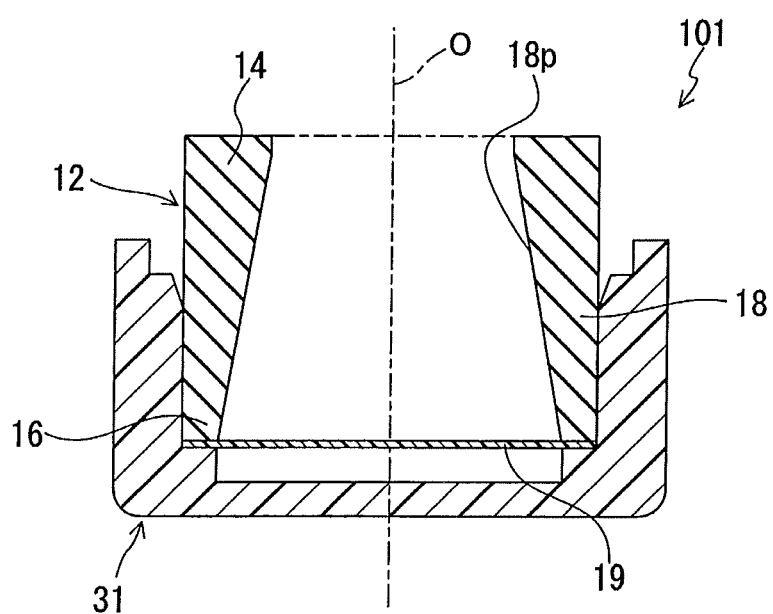
FIG. 4 is a cross section showing a modification of a tubular part.

A ventilation member 101 adopting a tubular part 12 as shown in FIG. 4 is also suitable. The ventilation member 101 includes the cover part 31 same as the one described with reference to FIG. 1 and the other related drawings. A difference is the internal structure of the tubular part 12.

The tubular part 12 shown in FIG. 4 is common with the tubular part 11 described above in that the opening area of a filter-end opening 16 is made larger than the opening area of a connection-end opening 14. To be more concrete, in the cross section encompassing the center axis line O (the cross section of FIG. 4), the tubular part 12 is configured to have a tapered surface inclined by a specific angle with respect to the center axis line O as an inner peripheral surface $18p$ of a body portion 18 between the connection-end opening 14 and the filter-end opening 16. When configured in this manner, the body portion 18 is of a shape whose diameter becomes larger as in the direction of the side of the filter-end opening 16 (frontward). By tapering the inner peripheral surface $18p$ in this manner, it is possible to have different opening diameters (opening areas) at the both ends. The tubular part 12 configured in this manner is inferior to the tubular part 11 described above in terms of the cooling time during injection molding. Nevertheless, it has an advantage that the relatively simple shape can reduce the tooling cost.

Second Embodiment

Figure 9:
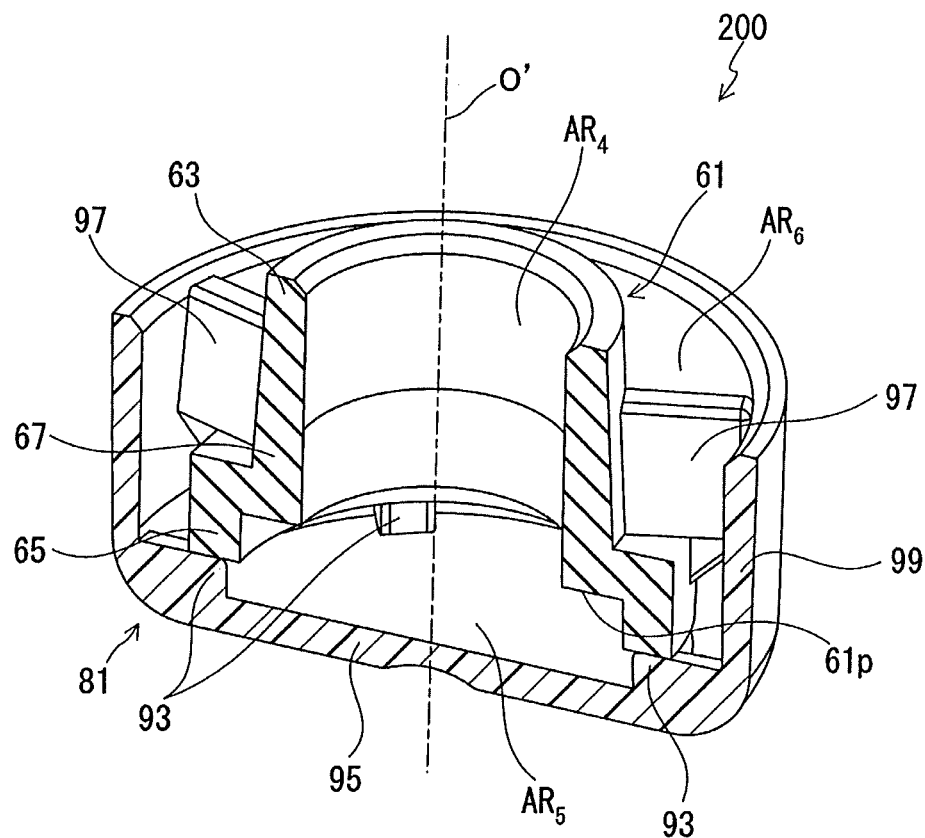
FIG. 9 is a sectional perspective view of a ventilation member of a second embodiment.
Figure 10:
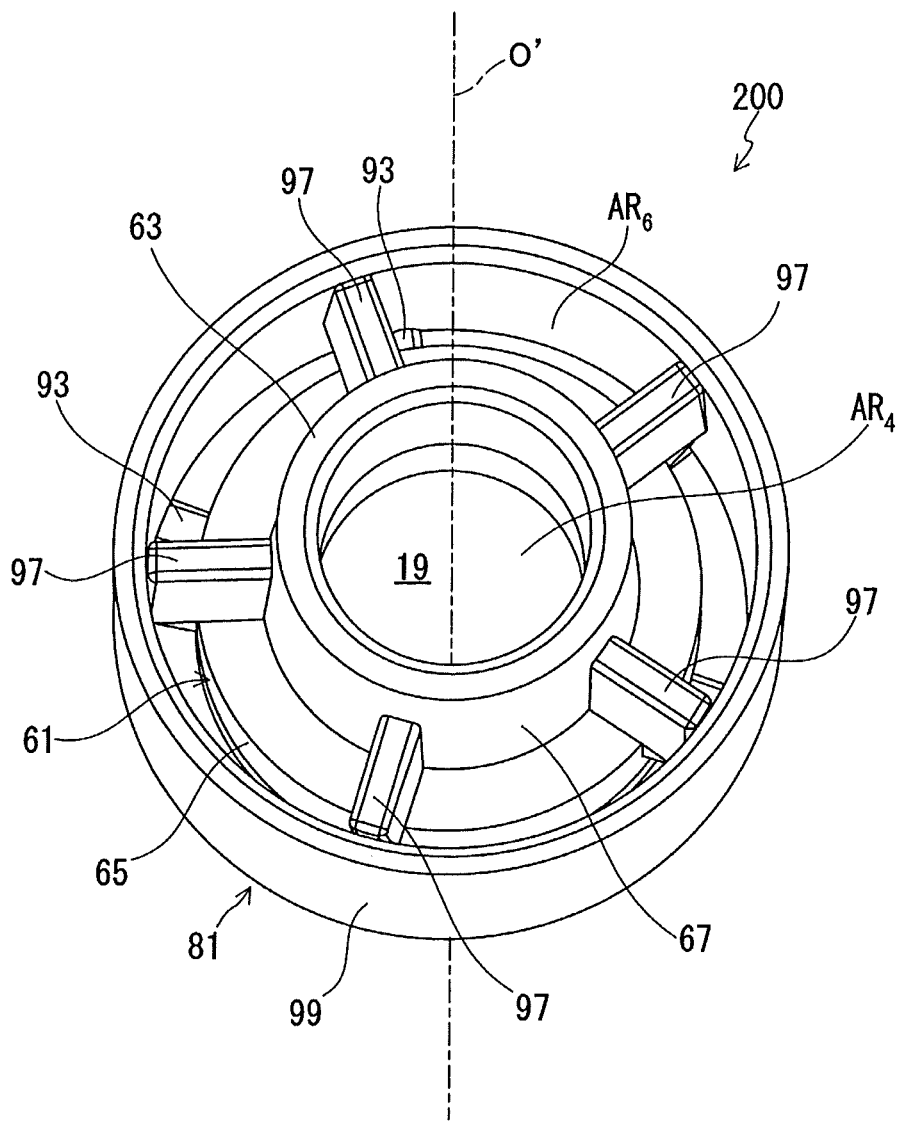
FIG. 10 is a perspective view of the ventilation member of FIG. 9.

FIG. 9 is a sectional perspective view of a second embodiment of the ventilation member of the invention. FIG. 10 is a perspective view of the ventilation member of FIG. 9. The gas permeable filter 19, however, is omitted in FIG. 9. Applicable objects and the function of a ventilation member 200 of the second embodiment are the same as those of the ventilation member 100 described in the first embodiment above. The configuration is also common in that a gas permeation quantity per unit time is increased owing to the effective area of the gas permeable filter 19 that is enlarged by making the opening area of a filter-end opening 65 larger than the opening area of a connection-end opening 63. A major difference from the embodiment described above is that fixing pieces 97, which play a crucial role in determining the relative positions of a tubular part 61 and a cover part 81, are formed integrally with the tubular part 61.

Figure 11:
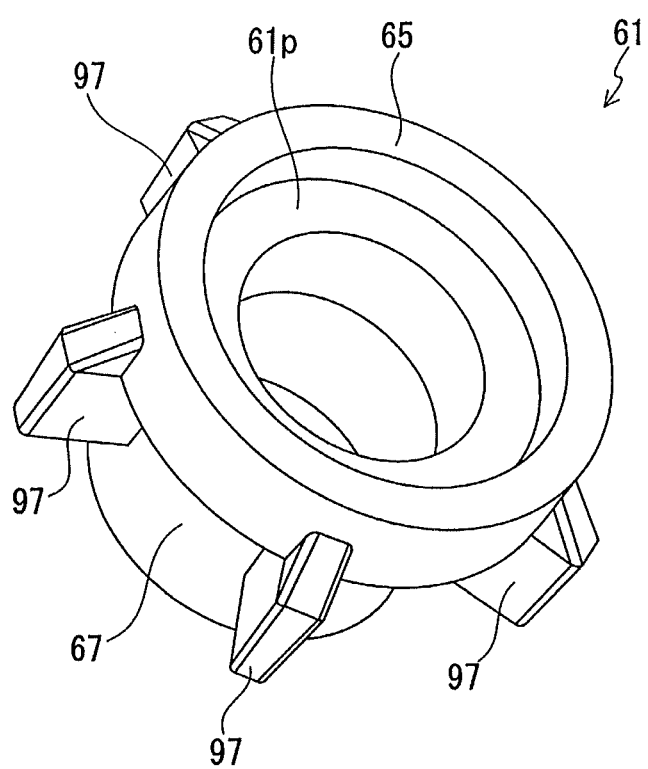
FIG. 11 is a perspective view of a tubular part when viewed from a filter-end opening.
Figure 12:
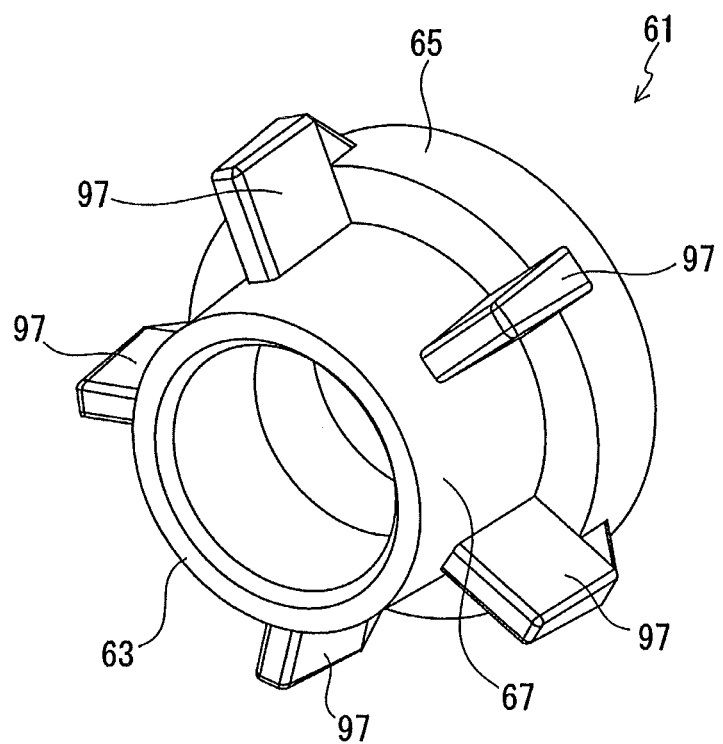
FIG. 12 is a perspective view of the tubular part when viewed from a connection-end opening.

As shown in FIG. 9 and FIG. 10, the ventilation member 200 includes the tubular part 61, the gas permeable filter 19, and the cover part 81. The tubular part 61 is formed of the connection-end opening 63, which is an opening to which a device that needs ventilation is to be connected, the filter-end opening 65, which is an opening to which the gas permeable filter 19 is attached, and a body portion 67 between the connection-end opening 63 and the filter-end opening 65. The interior of the body portion 67 defines a through-hole penetrating through from the connection-end opening 63 to the filter-end opening 65, and this through-hole forms a gas passage $AR_4$. As shown in FIG. 11 and FIG. 12, the body portion 67 of the tubular part 61 is of a stepped shape having a stepped surface $61p$ that is exposed to the inside of the through-hole (gas passage $AR_4$). The diameter of the body portion 67 starts to increase from the stepped surface $61p$. The filter-end opening 65 having a large opening area and the connection-end opening 63 having a small opening area thus are formed.

Figure 13:
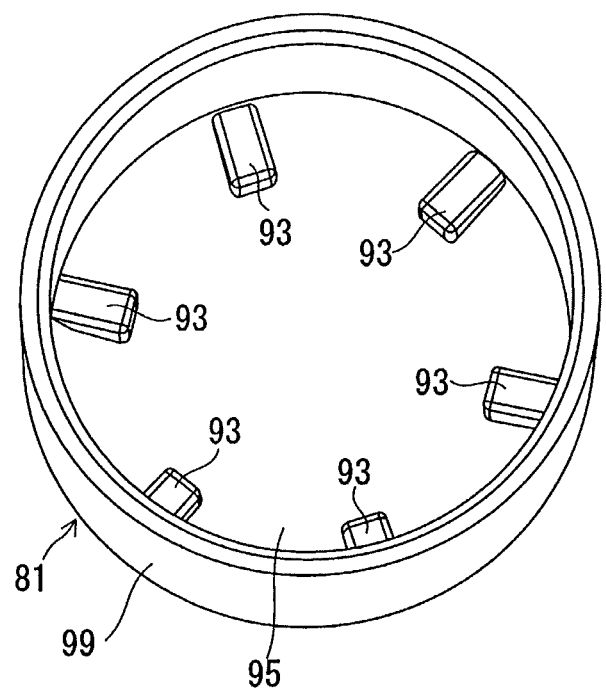
FIG. 13 is a perspective view of a cover part when viewed from a side from which the tubular part is fit therein.
Figure 14:
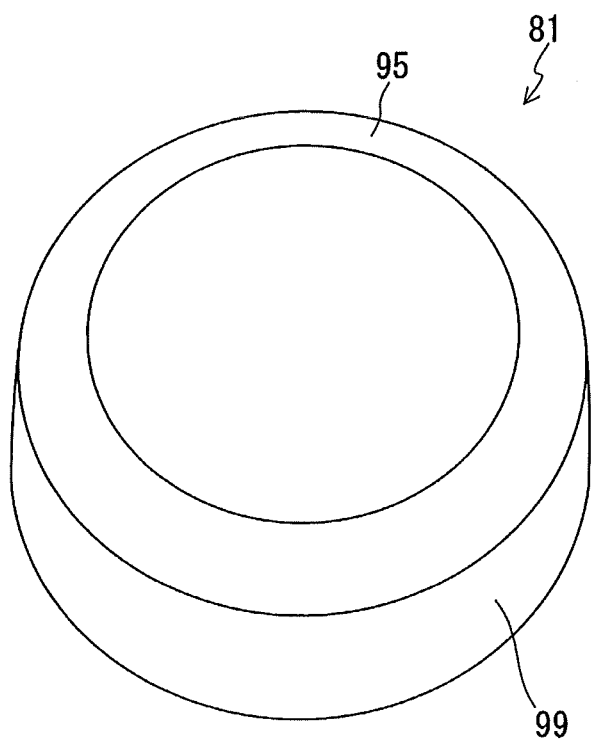
FIG. 14 is a perspective view of the cover part when viewed from the side opposite to the side of FIG. 13.

As shown in FIG. 13 and FIG. 14, the cover part 81 is the same as the cover part 31 of the first embodiment above except that the fixing pieces 37 are omitted. In short, spacers 93 are disposed on a bottom portion 95 of the cover part 81. By allowing the tubular part 61 to be seated on the spacers 93, it is possible to prevent the gas permeable filter 19 from contacting closely with the bottom portion 95. A gas passage $AR_5$ thus is defined.

As shown in FIG. 9 and FIG. 10, fixing pieces 97 that play a role of fixing the tubular part 61 to the cover part 81 are provided to the body portion 67 of the tubular part 61 in the rear of the stepped surface $61p$ at plural points in the circumferential direction at regular angular intervals. Each fixing piece 97 has a shape that protrudes outward in the radius direction about the center axis line O'. A protruding amount of the fixing pieces 97 in the outer side direction is adjusted to be larger than the major diameter of the filter-end opening 65. Accordingly, in an attached state where the tubular part 61 is fit into the cover part 81, the fixing pieces 97 are in contact with the inner peripheral surface of the side wall portion 99 of the cover part 81, which allows the fixing pieces 97 and the body portion 67 to undergo elastic deformation. Consequently, a contraction force acts on the tubular part 61 and the tubular part 61 is fixed to the inside of the cover part 81.

As is shown in FIG. 9, in the attached state where the tubular part 61 is fit into the cover part 81, the gas passage $AR_5$ is defined between the gas permeable filter 19 (not shown) and the bottom portion 95 of the cover part 81. Likewise, a gas passage $AR_6$ is defined between the outer peripheral surface of the tubular part 61 and the inner peripheral surface of the cover part 81. A gas thus is allowed to circulate between the gas passage $AR_4$ and the gas passages $AR_5$ and $AR_6$ via the gas permeable filter 19.

For the materials of the gas permeable filter 19, the tubular part 61, and the cover part 81, reference should be made to the description for the materials of the counterparts in the embodiment above.

Regarding the fixing pieces to fix the tubular part to the cover part, there is a case where they are provided to the cover part as in the first embodiment above and a case where they are provided to the tubular part as in the second embodiment. Further, as an example of the combination of the first example and the second example, the fixing pieces may be provided to each of the tubular part and the cover part.

Third Embodiment

Figure 15:
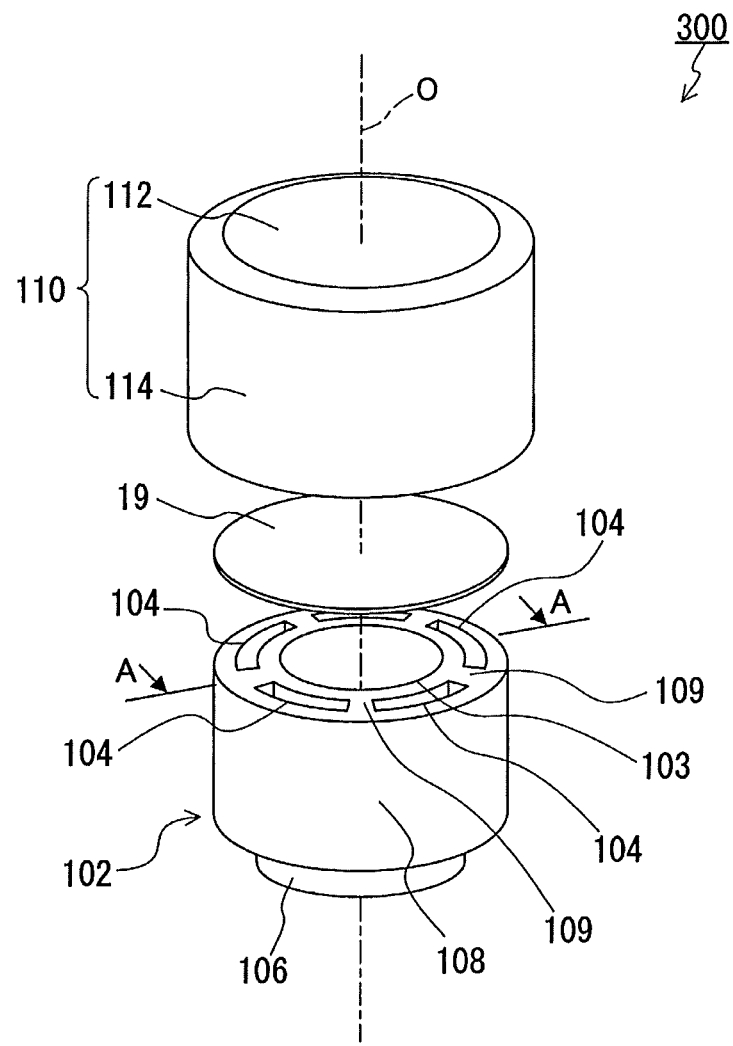
FIG. 15 is an exploded perspective view of a ventilation member of a third embodiment.
Figure 16:
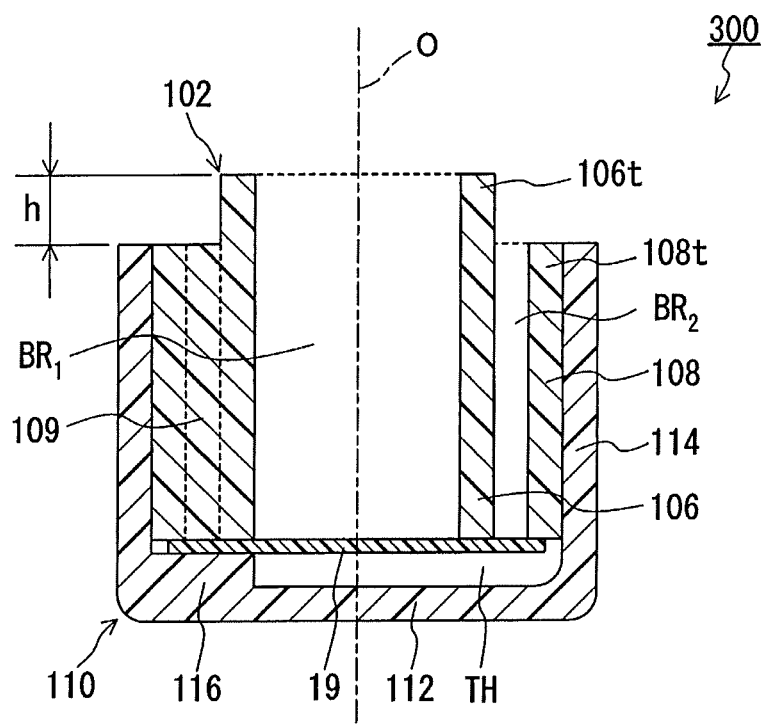
FIG. 16 is a longitudinal cross section of the ventilation member shown in FIG. 15.

FIG. 15 is an exploded perspective view of a third embodiment of the ventilation member of the invention. FIG. 16 is a longitudinal cross section of the ventilation member of FIG. 15.

As shown in FIG. 15 and FIG. 16, a ventilation member 300 includes a tubular part 102, a gas permeable filter 19, and a cover part 110. The tubular part 102 is of an almost circular cylindrical shape, and a first gas passage $BR_1$ and second gas passages $BR_2$ isolated from the first gas passage $BR_1$ are formed in the interior thereof. The first gas passage $BR_1$ is a gas passage that directly communicates with the interior space of the housing of a device. The second gas passages $BR_2$ are gas passages that directly communicate with the exterior space of the housing of the device and the ventilation member 300. The cover part 110 is a part inside of which the tubular part 102 is fit. It is formed of a bottom portion 112 forming a gap TH between itself and the gas permeable filter 19, a side wall portion 114 extending from the bottom portion 112 to surround the tubular part 102 from the outside, and spacers 116 that promote the formation of the gap TH by preventing the tubular part 102 from contacting closely with the bottom portion 112. The cover part 110 has a structure substantially similar to the counterparts in the embodiments described above.

The gas permeable filter 19 is attached to one end of the tubular part 102 so as to close an opening 103 on the basis of the first gas passage $BR_1$ and openings 104 on the basis of the second gas passages $BR_2$. A gas is allowed to circulate between the first gas passage $BR_1$ and the second gas passages $BR_2$ via the gap TH between the gas permeable filter 19 and the cover part 110 as well as the gas permeable filter 19. When configured in this manner, the gas headed in a direction from the first gas passage $BR_1$ to the second gas passages $BR_2$ or in the opposite direction passes through the interior of the tubular part 102 and the gas permeable filter 19 twice for each. It is thus possible to achieve a ventilation member that excels more in durability against foreign matter.

Also, as shown in the cross section of FIG. 16, the side wall portion 114 of the cover part 110 and the tubular part 102 are in close contact with each other across the entire region in the circumferential direction without forming any clearance. In other words, according to the ventilation member 300 of this embodiment, only the gas circulating in the second gas passages $BR_2$ is allowed to flow in and out between the interior and the exterior of the housing of the device. When configured in this manner, foreign matter will not enter through a clearance between the cover part 110 and the tubular part 102. The durability against foreign matter thus is enhanced further.

To be more concrete, the tubular part 102 includes an inner portion 106 in which the first gas passage $BR_1$ is formed, and an outer portion 108 that defines the second gas passages $BR_2$ between itself and the inner portion 106. The inner portion 106 is a portion to which the housing of the device is to be connected directly, and the outer portion 108 is a portion that is to directly contact closely with the side wall portion 114 of the cover part 110. These inner portion 106 and outer portion 108 are disposed concentrically, and the end face of the inner portion 106 and the end face of the outer portion 108 are flush with each other on the side on which the gas permeable filter 19 is attached. The opening 103 on the basis of the first gas passage $BR_1$ and the openings 104 on the basis of the second gas passages $BR_2$ are closed by the common gas permeable filter 19. In other words, not only the gap TH between the gas permeable filter 19 and the cover part 110 and the first gas passage $BR_1$ are partitioned by the gas permeable filter 19, but also the gap TH and the second gas passages $BR_2$ are partitioned by the gas permeable filter 19. When configured in this manner, should a part of the gas permeable filter 19 be damaged, the function of the ventilation member 300 is not lost as long as either one of the regional portion closing the first gas passage $BR_1$ and the regional portion closing the second gas passages $BR_2$ remains intact. The ventilation member 300 thus may be used continuously without causing a problem.

In addition, coupling portions 109, which are formed integrally with the inner portion 106 and the outer portion 108, are provided between these portions at plural points in the circumferential direction. The plural second gas passages $BR_2$ are formed between adjacent members of the adjacent coupling portions 109. The coupling portions 109 formed in this manner are able to secure the second gas passages $BR_2$ between the inner portion 106 and the outer portion 108 with ease. The coupling portions 109 can be made of the same elastomer as the one forming the inner portion 106 and the outer portion 108. When the tubular part 102 is fit inside the cover part 110, the coupling portions 109 undergo elastic deformation. The side wall portion 114 of the cover part 110 and the tubular part 102 thus are in close contact with each other across the entire region in the circumferential direction without forming any clearance. Hence, not only is it possible to firmly fix the tubular part 102 to the inside of the cover part 110, but it is also possible to attach the ventilation member 300 to the filter-attached portion 53 of the housing 51 (see FIG. 3) in a reliable manner. Further, it is preferable to locate the spacers 116 of the cover part 110 at positions corresponding to the positions of the coupling portions 109, that is, to bring the intervals of the spacers 116 to be disposed into agreement with the intervals of the coupling portion 109 to be disposed. When configured in this manner, it is possible to prevent the second gas passages $BR_2$ from being closed by the spaces 116.

Also, in this embodiment, only the single first gas passage $BR_1$ is formed so as to encompass the axis line O of the tubular part 102, and the second gas passages $BR_2$ are formed at plural points (five points) at equiangular intervals so as to surround the first gas passage $BR_1$. The number of the second gas passages $BR_2$ to be formed can be adjusted by taking the assembled strength between the tubular part 102 and the cover part 110 into account, and they can be formed, for example, at 2 to 15 points (preferably, 3 to 8 points). Also, in order to ensure the sufficient assembled strength between the tubular part 102 and the cover part 110 and to save space at the same time, the thickness of the inner portion 106 and the thickness of the outer portion 108 with respect to the radius direction are, for example, in a range of 0.5 mm to 1.0 mm both inclusive, respectively.

Also, assuming that the thickness direction of the gas permeable filter 19 is the axis line direction, the side in the axis line direction on which the gas permeable filter 19 is located is the front side, and the side on which the housing of the device is supposed to be located is the rear side, then the rear end portion 106$t$ of the inner portion 106 protrudes rearward more than the rear end portion 108$t$ of the outer portion 108. When configured in this manner, when the ventilation member 300 is attached to the housing of the device, it is possible to secure a suitable distance between the housing and the outer portion 108 of the tubular part 102. Consequently, it is possible to prevent the occurrence of water droplets or oil droplets adhering to the surface of the housing bridge the housing and the outer portion 108 of the tubular part 102 through the action of surface tension, thereby allowing the water droplets or oil droplets to close or enter into the second gas passages $BR_2$. By adjusting a protruding quantity h of the rear end portion 106$t$ of the inner portion 106 to fall within a range, for example, of 0.5 mm to 2 mm both inclusive, it is possible to achieve the advantages described above in a satisfactory manner without the need to substantially change the dimensions of the overall ventilation member 300.

Regarding the area of the opening 103 on the basis of the first gas passage $BR_1$ and the area of the openings 104 on the basis of the second gas passages $BR_2$, the one that should be larger the other is not particularly limited, and any of patters (1) through (3) as follows can be adopted:

(1) the area of the opening 103 on the basis of the first gas passage $BR_1$ is made larger than the area (a total of areas) of the openings 104 on the basis of the second gas passages $BR_2$;

(2) the area of the opening 103 on the basis of the first gas passage $BR_1$ is made smaller than the area (a total of areas) of the openings 104 on the basis of the second gas passages $BR_2$; and (3) the both areas are made equal.

To be more concrete, the area of the opening 103 on the basis of the first gas passage $BR_1$ can be in a range of 20 mm$^2$ to 130 mm² both inclusive (preferably, in a range of 30 mm² to 60 mm² both inclusive), and the area of the openings 104 on the basis of the second gas passages $BR_2$ can be in a range of 5 mm² to 140 mm² both inclusive (preferably, in a range of 5 mm² to 60 mm² both inclusive). It should be noted, however, that because the both gas passages $BR_1$ and $BR_2$ are closed by the gas permeable filter 19 in this embodiment, when the area of the opening on the basis of one of the gas passages is made too large in comparison with the area of the opening on the basis of the other gas passage, there is a concern that the gas permeation resistance increases. Accordingly, it is preferable to adjust the area S3 of the opening 103 on the basis of the first gas passage $BR_1$ and the area S4 of the openings 104 on the basis of the second gas passages $BR_2$ so that the ratio (S3/S4) thereof is 0.3 or greater (preferably, 0.8 or greater), and the absolute value of a difference of the areas of these openings, |S3−S4|, is 120 mm² or smaller (preferably, 30 mm² or smaller, and more preferably, 0).

Although it is not shown in the cross section of FIG. 16, when a cross section encompassing the axis line O that passes through the center of the tubular part 102 is observed, it is preferable to configured in such a manner that the outer peripheral surface of the tubular part 102 and the inner peripheral surface of the side wall portion 114 of the cover part 110 are tapered surfaces slightly inclined with respect to the axis line O. When configured in this manner, not only is it possible to increase the assembled strength between the tubular part 102 and the cover part 110, but it is also possible to increase the assembled strength between the filter-attached portion 53 of the housing 51 (see FIG. 3) and the ventilation member 300. More preferably, the angle between the outer peripheral surface of the tubular part 102 (or the inner peripheral surface of the side wall portion 114 of the cover part 110) appearing on the cross section and the axis line O is adjusted to fall within a range of 2° to 15° both inclusive (more preferably, in a range of 3° to 10° both inclusive).

Figure 17:
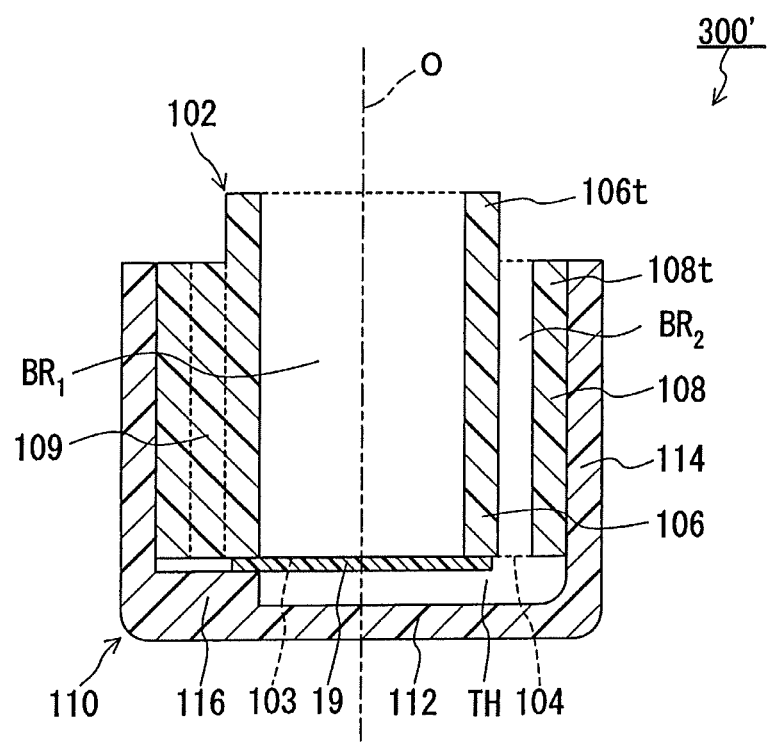
FIG. 17 is a longitudinal cross section showing a modification of the ventilation member of FIG. 15 and FIG. 16.

Alternatively, as with a ventilation member 300' shown in FIG. 17, it may be configured in such a manner that only the opening 103 on the basis of the first gas passage $BR_1$ is closed by the gas permeable filter 19 and the openings 104 on the basis of the second gas passages $BR_2$ are not closed by the gas permeable filter 19. When configured in this manner, the second gas passages $BR_2$ directly communicate with the gap TH between the gas permeable filter 19 and the bottom portion 112 of the cover part 110 without through the gas permeable filter 19. In other words, a gas headed from the interior to the exterior of the housing or in the opposite direction passes through the gas permeable filter 19 only once, which can reduce the gas permeation resistance. The gas permeation capability can be therefore enhanced. Alternatively, it may be configured in such a manner that only at least one of the plural second gas passages $BR_2$ is closed by the gas permeable filter 19 while the rest are not closed as in the example shown in FIG. 17.

In addition, tubular parts described below may be adopted instead of the tubular part 102 described with reference to FIG. 15 through FIG. 17.

Figure 18:
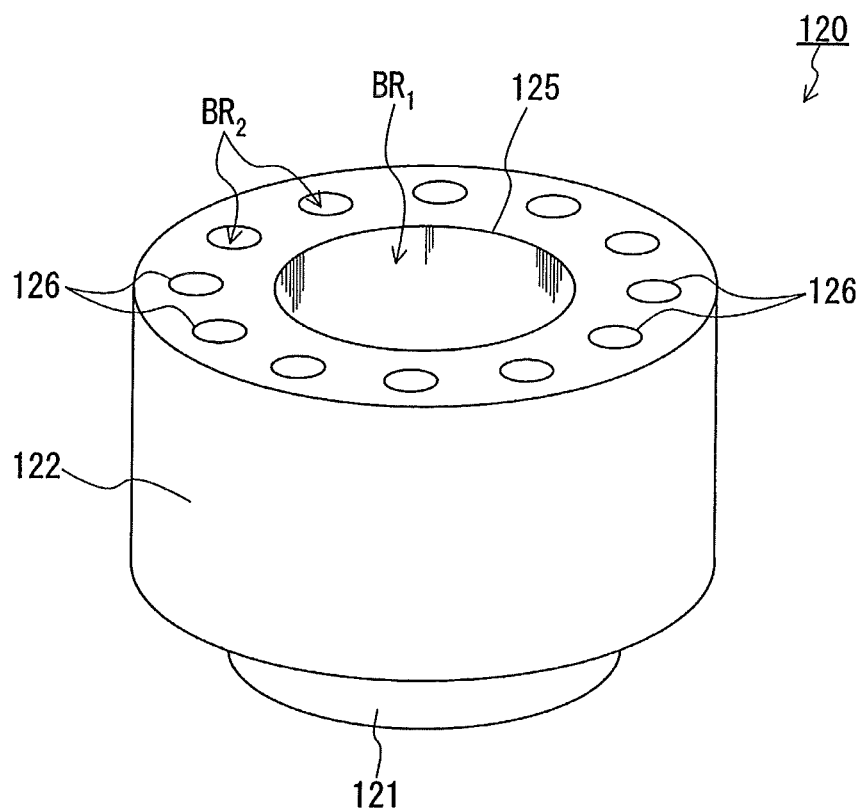
FIG. 18 is a perspective view of another suitable tubular part.

A tubular part 120 shown in FIG. 18 has the second gas passages $BR_2$ whose shape is improved. To be more specific, in this tubular part 120, an opening 125 on the basis of the first gas passage $BR_1$ and openings 126 on the basis of the second gas passages $BR_2$ are of a common circular shape. The configuration is common with the tubular part described above in that the first gas passage $BR_1$ is formed in the inner portion 121 and the second gas passages $BR_2$ are formed between the inner portion 121 and the outer portion 122.

Figure 19:
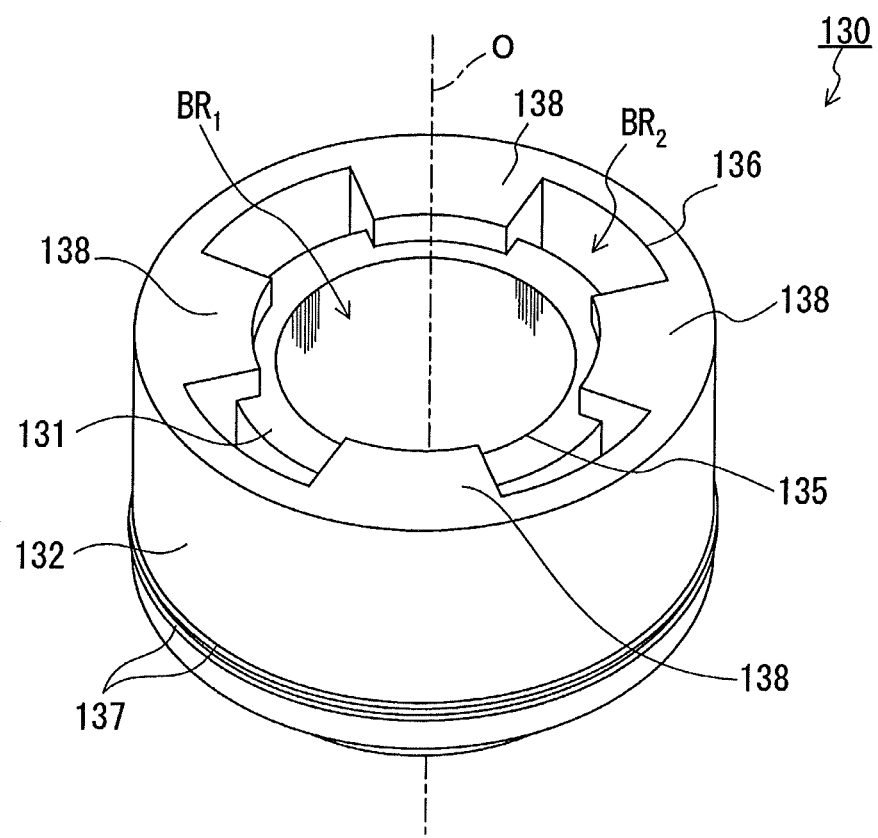
FIG. 19 is a perspective view of still another suitable tubular part.

A tubular part 130 shown in FIG. 19 has an outer portion 132 that protrudes frontward more than an inner portion 131. Also, coupling portions 138 interposed between the inner portion 131 and the outer portion 132 are almost flush with the outer portion 132 at a level in the axis line direction. The gas permeable filter 19 can be attached to the inner portion 131 so as to close only an opening 135 on the basis of the first gas passage $BR_1$. Openings 136 on the basis of the second gas passages $BR_2$ are not closed by the gas permeable filter 19 and are thereby exposed frontward in the axis line direction. In other words, the coupling portions 138 are used also as spacers that form a gap between the cover part 110 and the gas permeable filter 19. When configured in this manner, the spacers 116 in the cover part 110 can be omitted.

The tubular part 130 has a ring-like rib 137 protruding outward in the radius direction on the outer peripheral surface of the outer portion 132. By allowing the rib 137 to be positioned between the tubular part 130 and the side wall portion 114 of the cover part 110, it is possible to increase the assembled strength between the tubular part 130 and the cover part 110. It goes without saying that the rib 137 can be provided to the tubular part 102 shown in FIG. 15 and the tubular part 120 shown in FIG. 18. Alternatively, such a rib may be provided on the inner peripheral surface of the side wall portion of the cover part 110. The rib 137 may be provided in a single line. However, from the viewpoint of preventing the entry of foreign matter into a clearance between the tubular part 130 and the cover part 110, it is preferable to provide the ribs 137 in plural lines from top to bottom in the axis line direction as with the tubular part 130 of FIG. 19.

Figure 20:
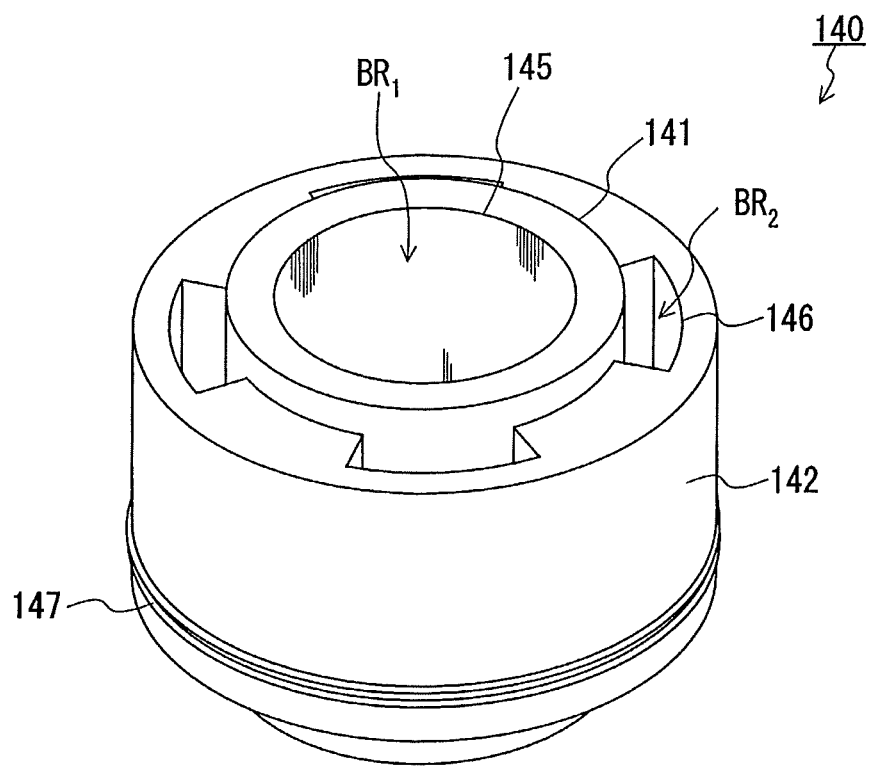
FIG. 20 is a perspective view of still another suitable tubular part.

A tubular part 140 shown in FIG. 20 has an inner portion 141 that protrudes frontward more than an outer portion 142. The gas permeable filter 19 can be attached to the inner portion 141 so as to close only an opening 145 on the basis of the first gas passage $BR_1$. By configuring in such a manner that openings 146 on the basis of the second gas passages $BR_2$ are not closed by the gas permeability filter 19, it is possible to achieve high gas permeation capability. Also, ribs 147 can increase the assembled strength between the tubular part 140 and the cover part 110.

Figure 21:
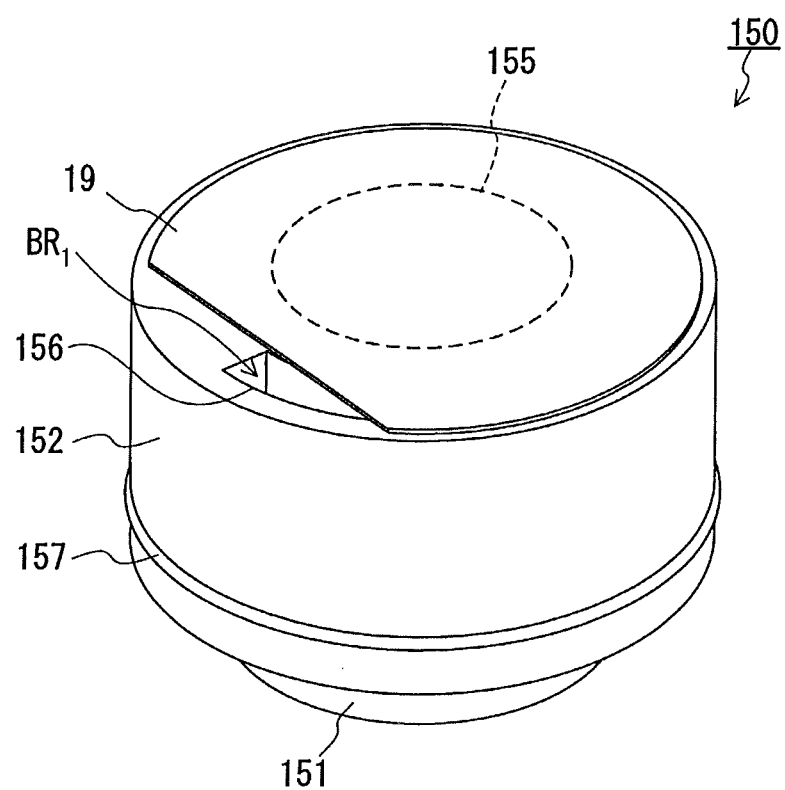
FIG. 21 is a perspective view of still another suitable tubular part.

A tubular part 150 shown in FIG. 21 has the first gas passage $BR_1$ and the second gas passage $BR_2$, each provided at a single point. The size of an opening 155 on the basis of the first gas passage $BR_1$ is the same as those in the tubular parts described above. However, the area of an opening 156 on the basis of the second gas passage $BR_2$ is made slightly smaller. Nevertheless, because the dimension of the gas permeable filter 19 is adjusted so that it closes only the opening 155 on the basis of the first gas passage $BR_1$, the opening 156 on the basis of the second gas passage $BR_2$ is not closed by the gas permeable filter 19. Accordingly, the tubular part 150 also achieves excellent durability and satisfactory gas permeation capability at the same time. The tubular part 150 also has an inner portion 151 that protrudes rearward in the axis line direction and an outer portion 152 that defines the second gas passage $BR_2$ between itself and the inner portion 151. It goes without saying that a rib 157 can be provided to the tubular part 150.

The invention claimed is:

1. A ventilation member, comprising:
   a tubular part, in an interior of which a gas passage for an object that needs ventilation is formed, the tubular part having a connection-end opening which is an opening on a side on which the object is to be connected, and a filter-end opening, and a body portion positioned between the connection-end opening and the filter-end opening;

a gas permeable filter disposed at the filter-end opening of the tubular part to close the filter end opening; and a cover part, inside of which the tubular part is fit, wherein:

the cover part includes a bottom portion that faces the gas permeable filter in an attached state where the tubular part is fit inside from a side of the gas permeable filter and a side wall portion that extends from the bottom portion so as to surround the filter-end opening and the body portion from outside;

gaps functioning as gas passages that communicate with an exterior are formed in the attached state between the bottom portion of the cover part and the gas permeable filter and between the side wall portion of the cover part and the body portion of the tubular part;

a material of the cover part is thermoplastic resin having no rubber elasticity;

a material of the tubular part is elastomer;

the cover part comprises fixing pieces formed on an inner surface of the side wall portion for securing the tubular part to the cover part, the fixing pieces each extending in a direction toward an opening of the cover part;

the fixing pieces push the tubular part toward a center axis line of the tubular part in the attached state, so that the tubular part is allowed to undergo elastic deformation, the center axis line being parallel to a thickness direction of the gas permeable filter, and the fixing pieces are configured to contact a side portion of a side wall of the tubular part in the attached state.

2. The ventilation member according to claim 1, wherein the body portion of the tubular part comprises an outer surface and an inner surface, the fixing pieces are in contact with the outer surface of the body portion in the attached state, and the body portion is compressed in a thickness direction thereof through elastic deformation of the body portion when the ventilation member is attached on a nozzle-like filter-attached portion such that the inner surface of the body portion is in contact with the nozzle-like filter-attached attached portion.

3. The ventilation member according to claim 1, wherein each fixing portion is tapered so as to ease attachment of the tubular part to the cover part.

4. The ventilation member according to claim 1, wherein the cover part comprises plural spacers that support the tubular part along the filter-end opening at the attached state, and the plural spacers prevent the bottom portion of the cover part from contacting closely with the ventilation filter entirely, so that one of the gaps formed between the bottom portion of the cover part and the gas permeable filter is secured.

5. The ventilation member according to claim 1, wherein the gas permeable filter is fixed on the tubular part.

6. The ventilation member according to claim 1, wherein the thermoplastic resin having no rubber elasticity is at least one selected from polypropylene, polyethylene, polyethylene terephthalate and ABS, and the elastomer is based on at least one selected from polystyrene, polyolefin, polyvinyl chloride, polyester, polyurethane, polyamide and fluoropolymer.

* * * * *